United States Patent
Kim et al.

(10) Patent No.: US 11,600,756 B2
(45) Date of Patent: Mar. 7, 2023

(54) DISPLAY DEVICE WITH BANK PATTERN

(71) Applicant: Samsung Display Co., Ltd., Yongin-si (KR)

(72) Inventors: Kyung Bae Kim, Yongin-si (KR); Ji Eun Lee, Yongin-si (KR); Chong Chul Chai, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/998,629

(22) Filed: Aug. 20, 2020

(65) Prior Publication Data

US 2021/0057623 A1 Feb. 25, 2021

(30) Foreign Application Priority Data

Aug. 22, 2019 (KR) .................. 10-2019-0103055

(51) Int. Cl.
*H01L 33/00* (2010.01)
*H01L 33/62* (2010.01)
*H01L 25/075* (2006.01)
*H01L 25/16* (2023.01)

(52) U.S. Cl.
CPC .......... *H01L 33/62* (2013.01); *H01L 25/0753* (2013.01); *H01L 25/167* (2013.01)

(58) Field of Classification Search
CPC ... H01L 33/62; H01L 25/0753; H01L 25/167; H01L 33/44; H01L 27/156; H01L 33/385; H01L 33/38; H01L 33/005
See application file for complete search history.

(56) References Cited

U.S. PATENT DOCUMENTS

| | | | |
|---|---|---|---|
| 10,008,645 B2 | 6/2018 | Bonar et al. | |
| 10,461,123 B2 | 10/2019 | Kim et al. | |
| 2007/0161211 A1* | 7/2007 | Sunohara | B81B 7/0067 438/455 |
| 2018/0019369 A1 | 1/2018 | Cho et al. | |
| 2018/0166424 A1* | 6/2018 | Sim | H01L 25/0753 |
| 2020/0105980 A1* | 4/2020 | Sim | H01L 33/54 |
| 2020/0135706 A1* | 4/2020 | Sa | H01L 25/167 |
| 2020/0203587 A1 | 6/2020 | Kim et al. | |
| 2020/0274039 A1* | 8/2020 | Chen | H01L 25/0753 |

FOREIGN PATENT DOCUMENTS

| | | |
|---|---|---|
| KR | 10-2017-0094930 | 8/2017 |
| KR | 10-2018-0007376 | 1/2018 |
| KR | 10-2018-0072909 | 7/2018 |
| KR | 10-1968592 | 4/2019 |

* cited by examiner

*Primary Examiner* — Ismail A Muse
(74) *Attorney, Agent, or Firm* — Lewis Roca Rothgerber Christie LLP

(57) ABSTRACT

A display device includes: a substrate including first areas and second areas alternately arranged in a first direction in a plane view; a first electrode and a second electrode on the substrate and spaced apart from each other in a second direction crossing the first direction; a first insulation layer on the substrate and covering the first electrode and the second electrode; and a light emitting element on the first insulation layer and electrically connected to the first electrode and the second electrode, the first insulation layer having a first thickness in the first area and a second thickness thicker than the first thickness in the second area, and the light emitting element being located in the first area.

18 Claims, 10 Drawing Sheets

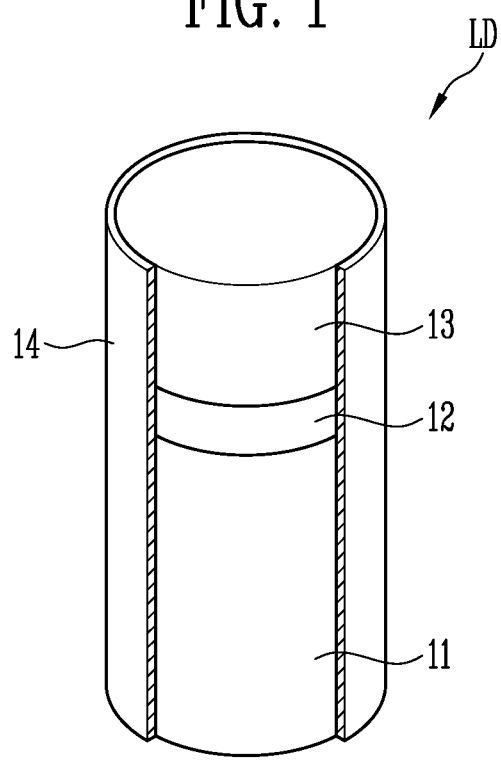

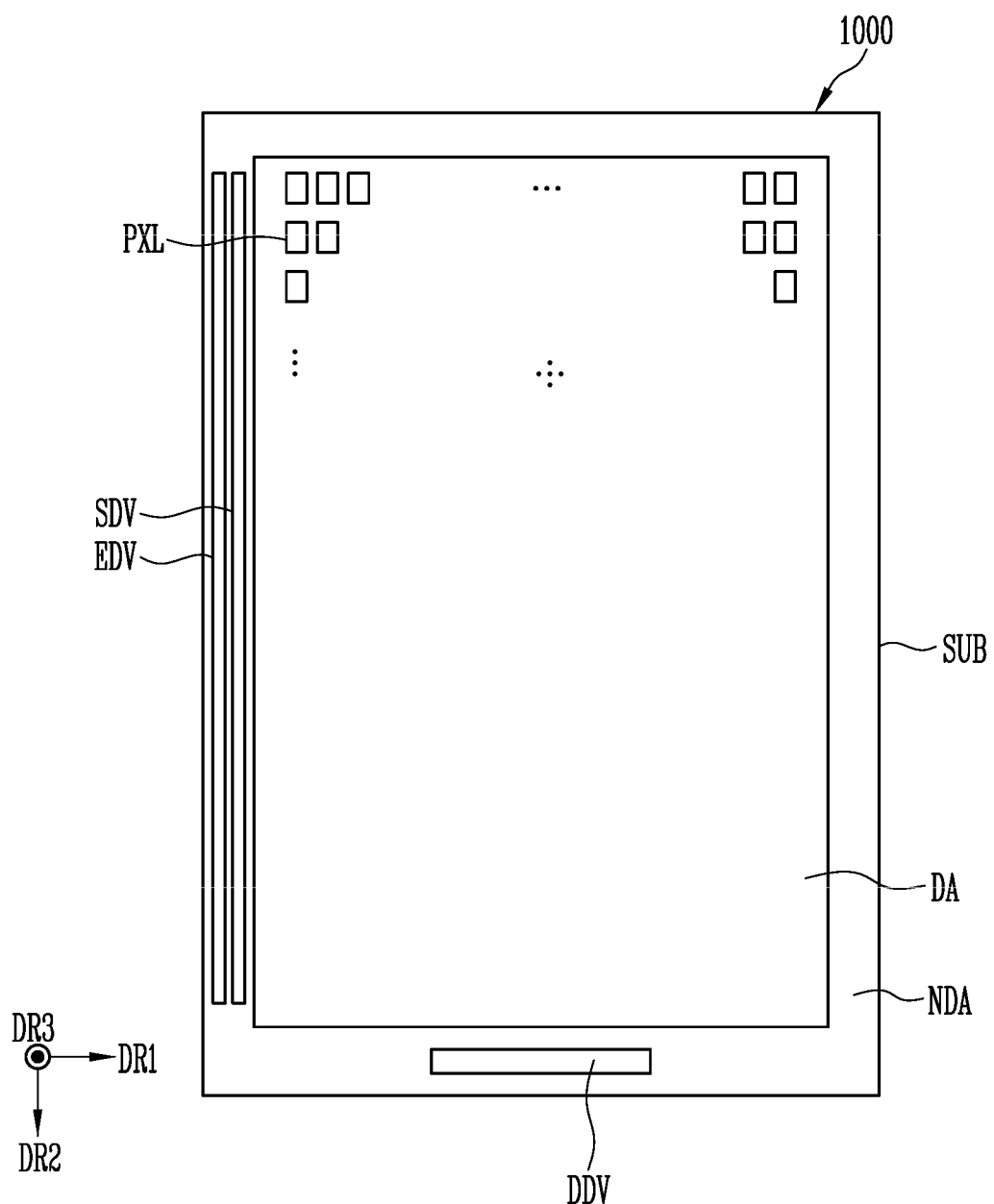

DISPLAY DEVICE WITH BANK PATTERN

CROSS-REFERENCE TO RELATED APPLICATION

This application claims priority to and the benefit of Korean Patent Application No. 10-2019-0103055, filed on Aug. 22, 2019 in the Korean Intellectual Property Office, the entire content of which is incorporated herein by reference.

BACKGROUND

1. Field

Aspects of embodiments of the present invention relate to a display device.

2. Description of the Related Art

A display device displays an image by using a light emitting element, such as a light emitting diode as a light source of a pixel. The light emitting diode exhibits relatively good durability, even in harsh environmental conditions, and excellent performance in terms of life span and luminance.

Recently, research has been conducted to manufacture a light emitting diode using a material having a high-reliability inorganic crystal structure, and to dispose it on a panel of a display device and use it as a next generation pixel light source. As part of this research, development of a light emitting display device using a light emitting diode as small as a micro-scale or nano-scale and using the light emitting diode as a light source for each pixel has been conducted.

SUMMARY

According to an aspect of embodiments of the present invention, a display device including a light emitting element is provided. According to another aspect of embodiments of the present invention, a display device with improved alignment of light emitting elements is provided.

According to another aspect of embodiments of the present invention, a display device is provided in which a manufacturing cost and manufacturing time is reduced by concurrently (e.g., simultaneously) forming an insulation layer disposed under a light emitting element, and a bank pattern surrounding the light emitting element.

However, aspects of the present invention are not limited to the aspects mentioned above, and other technical aspects that are not mentioned may be clearly understood by a person of ordinary skill in the art from the following description.

According to one or more embodiments of the present invention, a display device includes: a substrate including first areas and second areas alternately arranged in a first direction in a plane view; a first electrode and a second electrode on the substrate and spaced apart from each other in a second direction crossing the first direction; a first insulation layer on the substrate and covering the first electrode and the second electrode; and a light emitting element on the first insulation layer and electrically connected to the first electrode and the second electrode, the first insulation layer having a first thickness in the first area and a second thickness thicker than the first thickness in the second area, and the light emitting element being located in the first area.

The substrate may further include a bank area around the first areas and the second areas, and the display device may further include a bank pattern on the substrate and located in the bank area.

The bank pattern may be integrally formed with the first insulation layer.

The bank pattern may have a third thickness thicker than each of the first thickness and the second thickness.

The display device may further include a third electrode on the light emitting element and electrically connected to the first electrode and a first end portion of the light emitting element; and a fourth electrode on the light emitting element and electrically connected to the second electrode and a second end portion of the light emitting element.

The substrate may further include a contact area, and the first insulation layer may expose at least a portion of the first electrode and at least a portion of the second electrode in the contact area.

The first electrode may contact the third electrode, and the second electrode may contact the fourth electrode in the contact area.

The display device may further include a first bank layer between the substrate and the first electrode, and a second bank layer between the substrate and the second electrode, wherein each of a thickness of the first bank layer and a thickness of the second bank layer is thicker than the second thickness of the first insulation layer.

The display device may further include a second insulation layer on the substrate and covering the first insulation layer, the light emitting element, the third electrode, and the fourth electrode.

The first areas and the second areas may extend in the first direction.

The first areas may be spaced apart from each other in the first direction, and the second areas may surround the first areas.

The first insulation layer may have a fourth thickness on the first electrode and the second electrode, and the fourth thickness may be thicker than the first thickness.

According to one or more embodiments of the present invention, a display device includes: a substrate; a first electrode and a second electrode on the substrate and spaced apart from each other in a first direction; a first insulation layer on the substrate and covering the first electrode and the second electrode; a light emitting element on the first insulation layer and electrically connected to the first electrode and the second electrode; and a bank pattern on the substrate, and arranged around the light emitting element, wherein the first insulation layer and the bank pattern are integrally formed.

The display device may further include a third electrode on the light emitting element and electrically connected to the first electrode and a first end portion of the light emitting element; and a fourth electrode on the light emitting element and electrically connected to the second electrode and a second end portion of the light emitting element.

The substrate may further include a contact area, and the first insulation layer may expose at least a portion of the first electrode and at least a portion of the second electrode in the contact area.

The first electrode may contact the third electrode and the second electrode may contact the fourth electrode in the contact area.

The display device may further include a first bank layer between the substrate and the first electrode, and a second bank layer between the substrate and the second electrode, wherein a thickness of the first bank layer and a thickness of the second bank layer are thinner than a thickness of the bank pattern.

The display device may further include a second insulation layer on the substrate and covering the first insulation layer, the bank pattern, the light emitting element, the third electrode, and the fourth electrode.

Aspects of some other embodiments are included in the detailed description and drawings.

According to an aspect of one or more embodiments of the present invention, a display device with improved alignment of the light emitting elements is provided.

In addition, according to another aspect of embodiments of the present invention, a display device in which a manufacturing cost and manufacturing time is reduced by concurrently (e.g., simultaneously) forming an insulation layer disposed under a light emitting element and a bank pattern surrounding the light emitting element is provided.

However, aspects and effects of embodiments of the present invention are not limited to those described above, and further various aspects and effects are included in the present specification.

BRIEF DESCRIPTION OF THE DRAWINGS

FIG. 1 is a perspective view of a light emitting element according to an example embodiment.

FIG. 2 is a plan view schematically showing a display device according to an example embodiment.

DETAILED DESCRIPTION

Figure 3A:
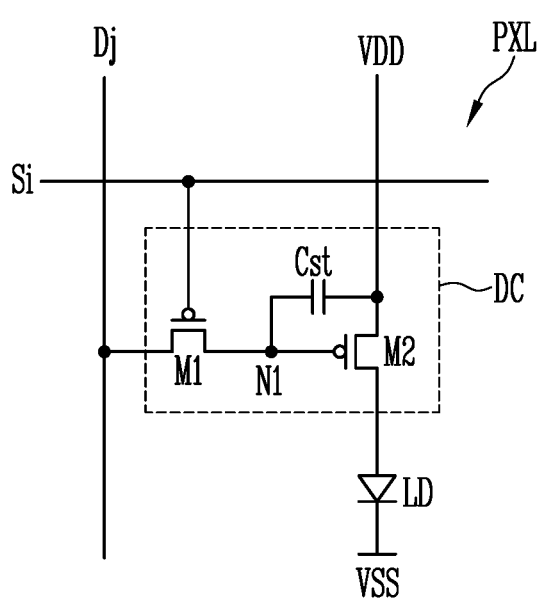
FIGS. 3A and 3B are circuit diagrams each showing a pixel according to an example embodiment.

Aspects and features of the present invention, and implementation methods thereof will be clarified through some example embodiments described with reference to the accompanying drawings. The present invention may, however, be embodied in different forms and should not be construed as limited to the embodiments set forth herein. Rather, these example embodiments are provided so that this disclosure will be thorough and will fully convey the scope of the present invention to those skilled in the art. Further, the present invention is defined by the scope of the claims.

It is to be understood that when an element or a layer is referred to as being "on" another element or layer, it may be directly on another element or layer, or one or more intervening elements or layers may also be present. The same reference numerals designate the same elements throughout the specification.

Although the terms "first," "second," and the like are used to describe various constituent elements, these constituent elements are not limited by these terms. These terms are used to distinguish one constituent element from another constituent element. Therefore, the first constituent elements described below may be the second constituent elements within the technical spirit of the present invention. When explaining the singular, unless explicitly described to the contrary, it may be interpreted as the plural meaning.

Further, some of the elements not directly related to the features of the present invention in the drawing may be omitted in order to clearly illustrate the present invention. In addition, some of the elements in the drawings may be shown in somewhat exaggerated sizes, ratios, and the like. For the same or similar constituent elements throughout the drawings, the same reference numerals and symbols may be provided even if they are displayed on different drawings, and duplicate descriptions may be omitted.

It is to be further understood that the terms "comprises" and/or "comprising" used herein specify the presence of stated features or components, but do not preclude the presence or addition of one or more other features or components.

In embodiments set forth herein, when a layer, area, or component is connected to another layer, area, or component, the layers, areas, or components may be directly connected to each other, and the layers, areas, or components may also be indirectly connected to each other with another layer, area, or component therebetween.

Unless otherwise defined, all terms (including technical and scientific terms) used herein have the same meaning as commonly understood by one of ordinary skill in the art to which example embodiments of the inventive concept belong. It is to be further understood that terms, such as those defined in commonly-used dictionaries, should be interpreted as having a meaning that is consistent with their meaning in the context of the relevant art and will not be interpreted in an idealized or overly formal sense unless expressly so defined herein.

Herein, referring to the accompanying drawings, some example embodiments of the present disclosure will be described in further detail.

FIG. 1 is a perspective view of a light emitting element according to an example embodiment of the present invention.

Referring to FIG. 1, a light emitting element LD according to an example embodiment of the present invention includes a first semiconductor layer 11, a second semiconductor layer 13, and an active layer 12 interposed between the first and second semiconductor layers 11 and 13. For example, the light emitting element LD may be implemented as a laminate in which the first semiconductor layer 11, the active layer 12, and the second semiconductor layer 13 are sequentially stacked.

According to an example embodiment of the present invention, the light emitting element LD may be provided in a rod shape extending in a direction. When an extending direction of the light emitting element LD is referred to as a length direction, the light emitting element LD may have a first end and a second end in the length direction.

In an example embodiment of the present invention, one of the first and second semiconductor layers 11 and 13 may be disposed at the first end of the light emitting element LD, and the other of the first and second semiconductor layers 11 and 13 may be disposed at the second end of the light emitting element LD.

In an example embodiment of the present invention, the light emitting element LD may be provided in a bar shape. Here, the term "bar shape" may include a rod-like shape or bar-like shape that is long (i.e., with an aspect ratio greater than 1) in the length direction, such as a circular cylinder or a polygonal cylinder. For example, a length of the light emitting element LD may be greater than a diameter of the light emitting element LD. However, the present invention is not limited thereto. For example, the light emitting element LD may have a core-shell structure.

For example, the light emitting element LD may be manufactured to be small enough to have a diameter and/or length of about micro-scale or nano-scale. For example, the diameter of the light emitting element LD may be 600 nm or less, and the length of the light emitting element LD may be 4 μm or less, but the size of the light emitting element LD is not limited thereto. The size of the light emitting element LD may be varied to meet requirements of a display device to which the light emitting element LD is applied.

For example, the first semiconductor layer 11 may include at least one n-type semiconductor layer. For example, the first semiconductor layer 11 may include at least one of semiconductor materials, such as InAlGaN, GaN, AlGaN, InGaN, AlN, or InN, and may include a semiconductor layer doped with a first dopant, such as Si, Ge, Sn, and the like.

However, the material constituting the first semiconductor layer 11 is not limited thereto, and the first semiconductor layer 11 may be formed of any of various materials in addition thereto.

The active layer 12 may be formed on the first semiconductor layer 11 and may be formed as a single or multiple quantum well structure. In an embodiment, the active layer 12 may emit light with a wavelength of 400 nm to 900 nm, and may use a double hetero-structure. According to an example embodiment of the present invention, a cladding layer (not shown) doped with a dopant may be formed on and/or under the active layer 12. For example, the cladding layer may be implemented as an AlGaN layer or an InAlGaN layer. In addition, materials such as AlGaN and AlInGaN may also be used as the active layer 12. However, any of various materials in addition thereto may form the active layer 12.

When an electric field of a predetermined voltage or more is applied to both ends of the light emitting element LD, the light emitting element LD emits light while electron-hole pairs are combined in the active layer 12. By controlling an emission of the light emitting element LD using this principle, the light emitting element LD may be used as a light source of various light emitting devices including a pixel of the display device.

The second semiconductor layer 13 may be provided on the active layer 12 and may include a semiconductor layer of a type different from that of the first semiconductor layer 11. For example, the second semiconductor layer 13 may include at least one p-type semiconductor layer. For example, the second semiconductor layer 13 may include at least one of semiconductor materials, such as InAlGaN, GaN, AlGaN, InGaN, AlN, InN, and may include a semiconductor layer doped with a second dopant, such as Mg, and the like. However, the material forming the second semiconductor layer 13 is not limited thereto, and the second semiconductor layer 13 may be formed of any of various materials.

According to an example embodiment of the present invention, the light emitting element LD may further include a different phosphor layer, an active layer, a semiconductor layer, and/or an electrode layer on and/or under each layer in addition to the first semiconductor layer 11, the active layer 12, and the second semiconductor layer 13 described above.

In addition, the light emitting element LD may further include an insulation layer 14. However, according to an example embodiment of the present invention, the insulation layer 14 may be omitted or may be provided so as to cover only a portion of the first semiconductor layer 11, the active layer 12, and the second semiconductor layer 13. For example, the insulation layer 14 may be provided at portions except for both ends of the light emitting element LD such that the both ends of the light emitting element LD may be exposed.

For better understanding and ease of description, FIG. 1 shows a shape in which a portion of the insulation layer 14 is shown removed, but all sides of the light emitting element LD may be surrounded by the insulation layer 14.

According to an example embodiment of the present invention, the insulation layer 14 may include a transparent insulation material. For example, the insulation layer 14 may include at least one of insulation materials, such as $SiO_2$, $Si_3N_4$, $Al_2O_3$, and $TiO_2$, but is not limited thereto. The insulation layer 14 may include any of various insulation materials.

The insulation layer 14 may prevent or substantially prevent an electric short that may occur due to the active layer 12 contacting a conductive material other than the first semiconductor layer 11 and the second semiconductor layer 13. In addition, by forming the insulation layer 14, it is possible to minimize or reduce surface defects of the light emitting element LD to improve life span and efficiency. In addition, when a plurality of light emitting elements LD are closely disposed, the insulation layer 14 may prevent or substantially prevent an unwanted short that may occur between the light emitting elements LD.

A type, structure, and shape of the light emitting element LD according to an example embodiment of the present invention may be variously changed.

FIG. 2 is a plan view schematically showing a display device according to an example embodiment.

Referring to FIGS. 1 and 2, a display device 1000 according to an embodiment may include a substrate SUB and a plurality of pixels PXL provided on the substrate SUB. In further detail, the display device 1000 may include a display area DA for displaying an image and a non-display area NDA excluding the display area DA.

The display area DA may be an area in which the pixels PXL for displaying the image are provided. The non-display area NDA may be an area in which drivers for driving the pixels PXL of the display area DA and various line units (not shown) for connecting the pixels PXL and the drivers are provided.

The display area DA may have any of various shapes. For example, the display area DA may be provided in any of various shapes, such as a closed polygon including a side formed of a straight line, a circle, an ellipse, etc. including a side formed of a curved line, or a semicircle, semi-ellipse, etc. including a side formed of a straight line and a curved line.

When the display area DA includes a plurality of areas, each area may also be provided in any of various shapes, such as a closed polygon including a side formed of a straight line, or a semicircle, a semi-ellipse, etc. including a side formed of a curved line. In addition, areas of a plurality of areas may be the same as or different from each other.

In an example embodiment of the present invention, a case in which the display area DA is provided as one area having a quadrangle shape including a side of a straight line will be described as an example.

The non-display area NDA may be provided at at least one side of the display area DA. In an example embodiment of the present invention, the non-display area NDA may surround the display area DA.

The pixels PXL may be provided in the display area DA on the substrate SUB. Each of the pixels PXL may include at least one light emitting element LD driven by a corresponding scan signal and data signal.

The pixels PXL may include a light emitting element emitting white light and/or color light. Each pixel PXL may emit any one of red, green, and blue colors, but is not limited thereto. For example, each pixel PXL may emit any one of cyan, magenta, yellow, and white colors.

The pixels PXL may be provided in plural and arranged in a matrix form along a row extending in a first direction DR1 and a column extending in a second direction DR2 crossing the first direction DR1. However, an arrangement form of the pixels PXL is not particularly limited, and may be arranged in any of various forms.

The driver may provide a signal to each pixel PXL through a line unit (not shown), thereby controlling a driving of the pixel PXL. The line unit is omitted in FIG. 2 for better understanding and ease of description.

In an embodiment, the driver may include a scan driver SDV that provides a scan signal to the pixels PXL through a scan line, an emission driver EDV that provides an emission control signal to the pixels PXL through an emission control line, a data driver DDV that provides a data signal to the pixels PXL through a data line, and a timing controller (not shown). The timing controller may control the scan driver SDV, the emission driver EDV, and the data driver DDV.

In an example embodiment, each pixel PXL may be formed of an active pixel. However, a type, structure, and/or driving method of the pixels PXL capable of being applied to the present invention is not particularly limited.

Figure 3B:
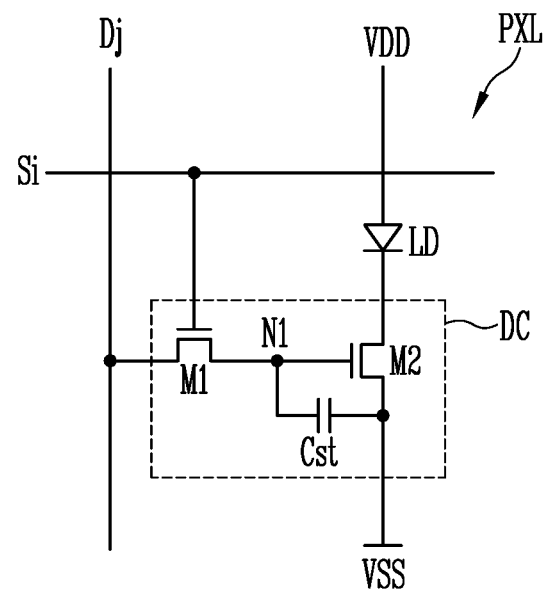

FIGS. 3A and 3B are circuit diagrams each showing a pixel according to an example embodiment. In particular, FIGS. 3A and 3B show an example of pixels constituting a light emitting display panel of an active type. FIGS. 3A and 3B show one pixel connected to a j-th data line Dj (here, j is a positive integer greater than 1) and an i-th scan line Si (here, i is a positive integer greater than 1) for better understanding and ease of description.

Referring to FIG. 3A, the pixel PXL may include at least one light emitting element LD and a pixel driving circuit DC connected thereto to drive the light emitting element LD.

The first electrode (e.g., anode) of the light emitting element LD may be connected to a first driving power supply VDD via the pixel driving circuit DC, and a second electrode (e.g., cathode) of the light emitting element LD may be connected to a second driving power supply VSS.

The first driving power supply VDD and the second driving power supply VSS may have different potentials from each other. For example, a potential of the second driving power supply VSS may be lower than a potential of the first driving power supply VDD by a threshold voltage of the light emitting element LD or more.

In an embodiment, the light emitting element LD may emit light with luminance corresponding to a driving current controlled by the pixel driving circuit DC.

FIG. 3A shows an example embodiment in which only one light emitting element LD is included in one pixel PXL, but the present invention is not limited thereto. For example, the pixel PXL may include a plurality of light emitting elements that are connected with each other in parallel and/or in series.

According to an example embodiment of the present invention, the pixel driving circuit DC may include a first transistor M1, a second transistor M2, and a storage capacitor Cst. However, a structure of the pixel driving circuit DC is not limited to the example embodiment shown in FIG. 3A. According to an example embodiment, the pixel PXL may further include a pixel sensing circuit (not shown). The pixel sensing circuit may measure a value of a driving current of each pixel PXL, and transfer the measured value to an external circuit (e.g., timing controller) to compensate each pixel PXL.

A first electrode of the first transistor M1 (i.e., switching transistor) is connected to the data line Dj, and a second electrode thereof is connected to a first node N1. Here, the first electrode and the second electrode of the first transistor M1 may be different electrodes from each other, and when the first electrode is a source electrode, the second electrode may be a drain electrode. A gate electrode of the first transistor M1 may be connected to the scan line Si.

When a scan signal of a voltage (e.g., gate-on voltage) at which the first transistor M1 can be turned on is supplied from the scan line Si, the first transistor M1 may be turned on to electrically connect the data line Dj and the first node N1. At this time, the data signal of the corresponding frame may be supplied to the data line Dj, and, thus, the data signal may be transferred to the first node N1. The data signal transferred to the first node N1 may be stored in the storage capacitor Cst.

A first electrode of the second transistor M2 (i.e., driving transistor) may be connected to the first driving power supply VDD, and the second electrode thereof may be electrically connected to the first electrode (e.g., anode) of the light emitting element LD. A gate electrode of the second transistor M2 may be connected to the first node N1. The second transistor M2 may control an amount of a driving current supplied to the light emitting element LD in response to a voltage of the first node N1.

One electrode of the storage capacitor Cst may be connected to the first driving power supply VDD, and the other electrode thereof may be connected to the first node N1. The storage capacitor Cst may charge a voltage corresponding to the data signal supplied to the first node N1 and maintain the charged voltage until the data signal of the next frame is supplied.

For better understanding and ease of description, FIG. 3A shows a relatively simple driving circuit DC including the first transistor M1 for transferring the data signal into the pixel PXL, the storage capacitor Cst for storing the data signal, and the second transistor M2 for supplying a driving current corresponding to the data signal to the light emitting element LD.

However, the present invention is not limited thereto, and a structure of the driving circuit DC may be variously changed. For example, the driving circuit DC may further include at least one transistor, such as a transistor for compensating a threshold voltage of the second transistor M2, a transistor for initializing the first node N1 and/or a transistor for controlling an emission time of the light emitting element LD, and/or other circuit elements such as a boosting capacitor for boosting a voltage of the first node N1, or the like.

In addition, transistors included in the driving circuit DC, for example, both the first and second transistors M1 and M2 are shown as P-type transistors in FIG. 3A, but the present invention is not limited thereto. For example, at least one of the first and second transistors M1 and M2 included in the driving circuit DC may be an N-type transistor.

For example, referring to FIG. 3B, the first and second transistors M1 and M2 of the driving circuit DC may be implemented as N-type transistors. The driving circuit DC shown in FIG. 3B is similar in configuration and/or operation to the driving circuit DC shown in FIG. 3A except for a change of a connection position of some constituent elements due to a change of a transistor type. Therefore, further detailed description thereof will be omitted.

Figure 4:
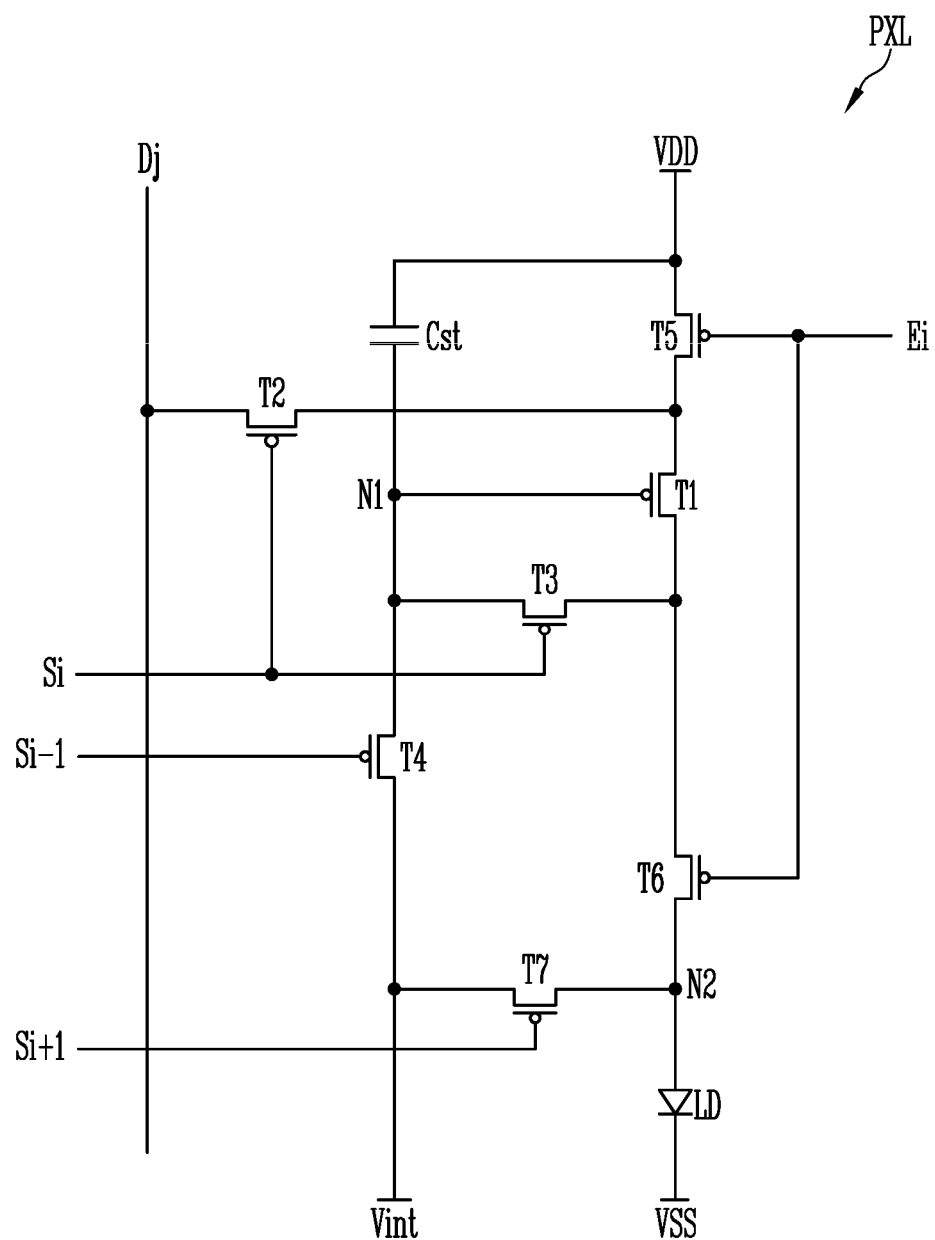
FIG. 4 is a circuit diagram showing a pixel according to another example embodiment.

FIG. 4 is a circuit diagram showing a pixel according to another example embodiment. For better understanding and ease of description, FIG. 4 shows one pixel connected to a j-th data line Dj, an i−1-th scan line Si−1, an i-th scan line Si, and an i+1-th scan line Si+1.

Referring to FIG. 4, the pixel PXL according to another example embodiment of the present invention may include a light emitting element LD, first to seventh transistors T1, T2, T3, T4, T5, T6, and T7, and a storage capacitor Cst.

A first electrode (e.g., anode) of the light emitting element LD may be connected to the first transistor T1 via a sixth transistor T6, and a second electrode (e.g., cathode) of the light emitting element LD may be connected to the second driving power supply VSS. The light emitting element LD may emit light with luminance (e.g., predetermined luminance) corresponding to an amount of current supplied from the first transistor T1.

One electrode of the first transistor T1 (i.e., driving transistor) may be connected to the first driving power supply VDD via a fifth transistor T5, and the other electrode thereof may be connected to the first electrode of the light emitting element LD via the sixth transistor T6. The first transistor T1 may control an amount of current flowing from the first driving power supply VDD to the second driving power supply VSS via the light emitting element LD in response to a voltage of the first node N1 which is a gate electrode of the first transistor T1.

The second transistor T2 (i.e., switching transistor) may be connected between the j-th data line Dj and one electrode of the first transistor T1. A gate electrode of the second transistor T2 may be connected to the i-th scan line Si. The second transistor T2 may be turned on when a scan signal of a gate-on voltage is supplied to the i-th scan line Si to electrically connect the j-th data line Dj and one electrode of the first transistor T1.

The third transistor T3 may be connected between the other electrode of the first transistor T1 and the first node N1. A gate electrode of the third transistor T3 may be connected to the i-th scan line Si. The third transistor T3 may be turned on when a scan signal of a gate-on voltage is supplied to the i-th scan line Si to electrically connect the other electrode of the first transistor T1 and the first node N1.

The fourth transistor T4 may be connected between the first node N1 and an initialization power supply Vint. A gate electrode of the fourth transistor T4 may be connected to the i−1-th scan line Si−1. The fourth transistor T4 may be turned on when a scan signal of a gate-on voltage is supplied to the i−1-th scan line Si−1 to supply a voltage of the initialization power supply Vint to the first node N1. Here, the initialization power supply Vint may be set to a voltage lower than a data signal.

The fifth transistor T5 may be connected between the first driving power supply VDD and one electrode of the first transistor T1. A gate electrode of the fifth transistor T5 may be connected to an i-th emission control line Ei. The fifth transistor T5 may be turned on when an emission control signal of a gate-on voltage is supplied to the i-th emission control line Ei, and may be turned off in other cases.

The sixth transistor T6 may be connected between the other electrode of the first transistor T1 and the first electrode of the light emitting element LD. A gate electrode of the sixth transistor T6 may be connected to the i-th emission control line Ei. The sixth transistor T6 may be turned on when the emission control signal of a gate-on voltage is supplied to the i-th emission control line Ei, and may be turned off in other cases.

The seventh transistor T7 may be connected between the initialization power supply Vint and the first electrode of the light emitting element LD. The gate electrode of the seventh transistor T7 may be connected to the i+1-th scan line Si+1. The seventh transistor T7 may be turned on when a scan signal of a gate-on voltage is supplied to the i+1-th scan line Si+1 to supply a voltage of the initialization power supply Vint to the first electrode of the light emitting element LD.

The storage capacitor Cst may be connected between the first driving power supply VDD and the first node N1. The storage capacitor Cst may store a voltage corresponding to the data signal and the threshold voltage of the first transistor T1.

In an embodiment, transistors included in the driving circuit DC, for example, first to seventh transistors T1, T2, T3, T4, T5, T6, and T7 are all shown to P-type transistors in FIG. 4, but the present invention is not limited thereto. For example, at least one of the first to seventh transistors T1, T2, T3, T4, T5, T6, and T7 may be an N-type transistor.

Figure 5:
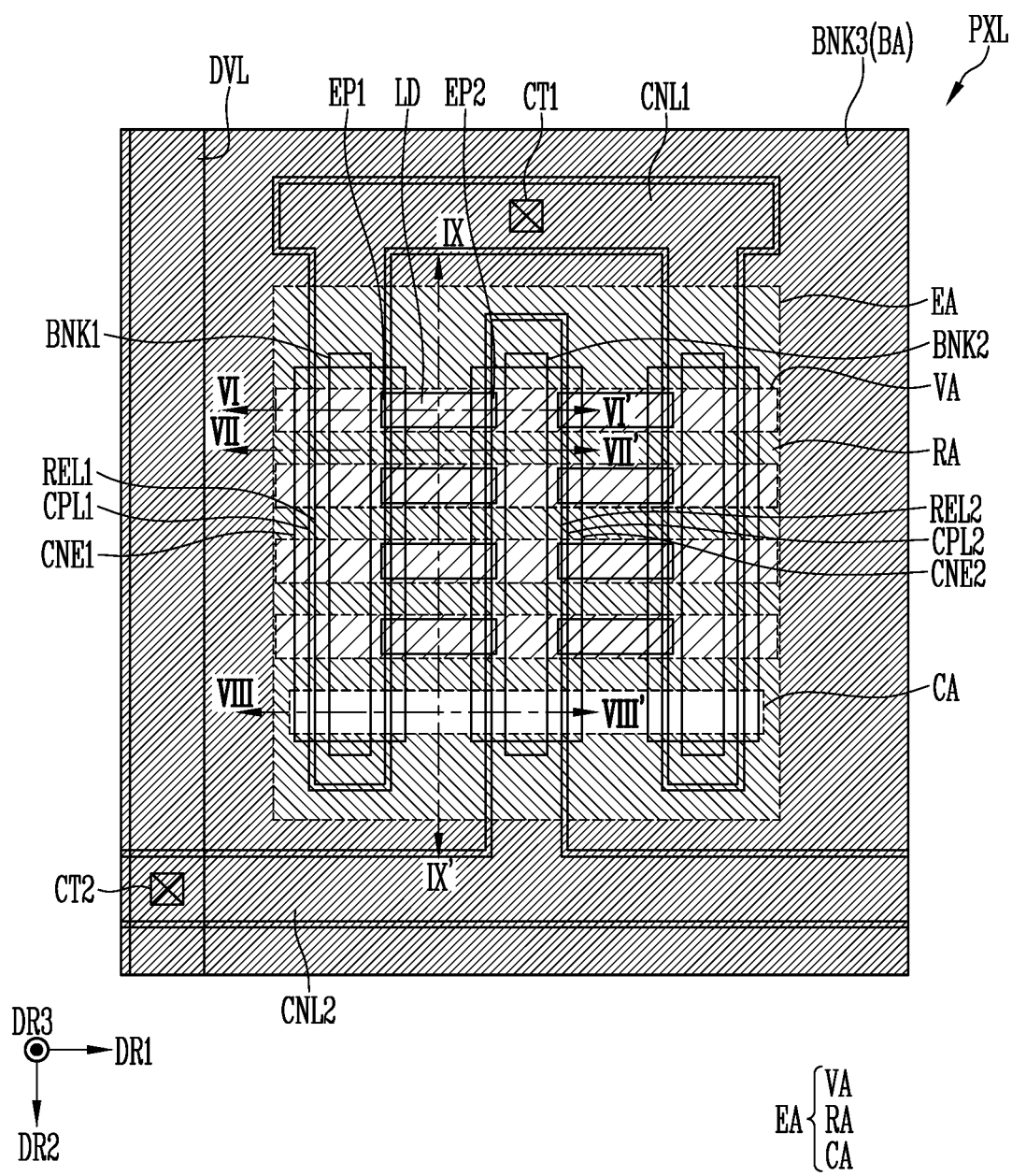
FIG. 5 is a plan view of a pixel according to an example embodiment.
Figure 6:
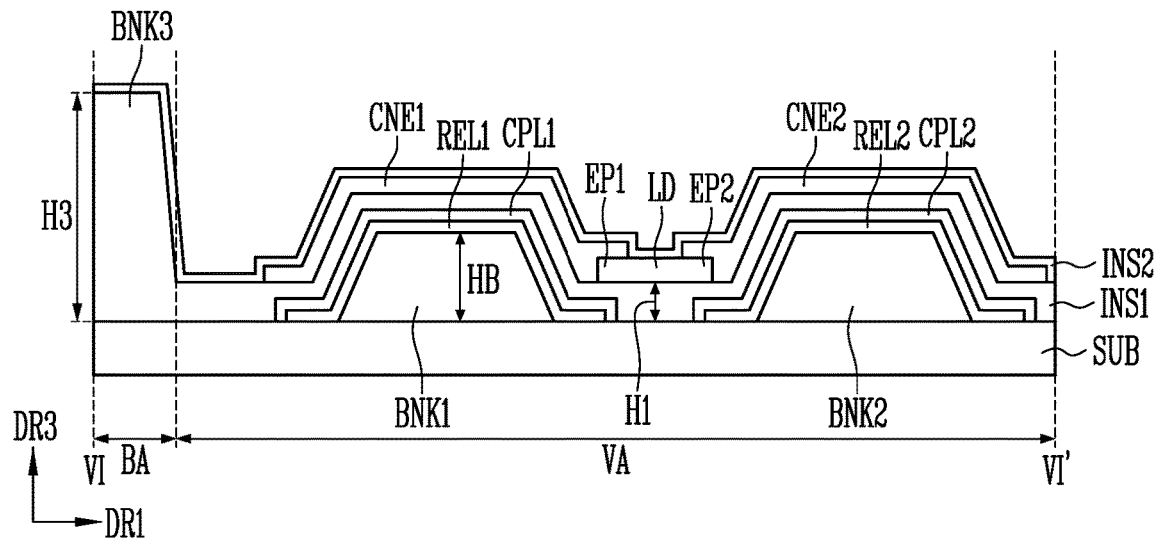
FIG. 6 is a cross-sectional view taken along the line VI-VI' of FIG. 5.
Figure 7:
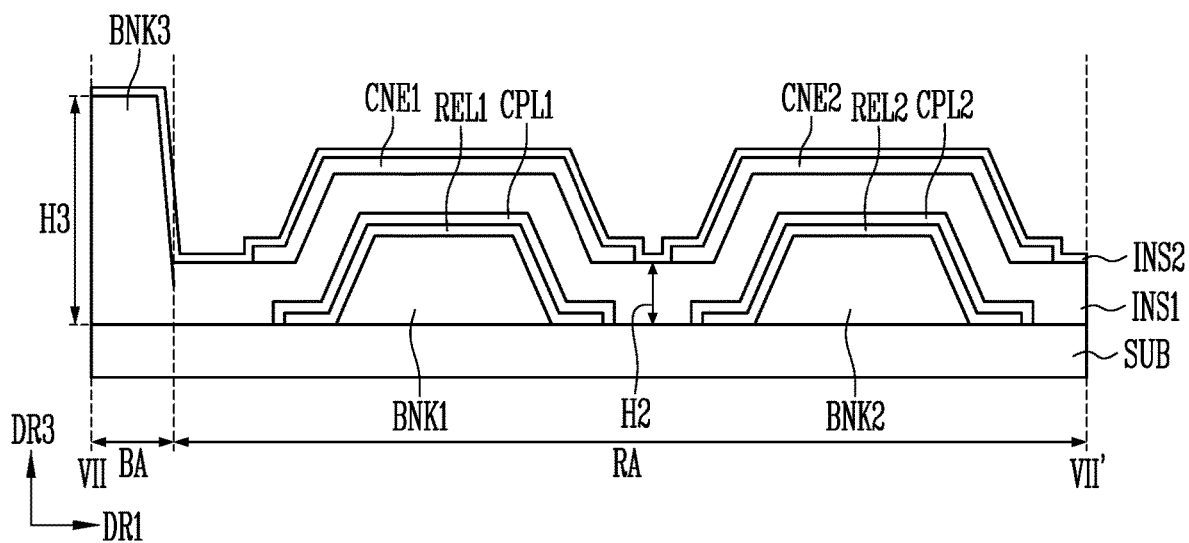
FIG. 7 is a cross-sectional view taken along the line VII-VII' of FIG. 5.
Figure 8:
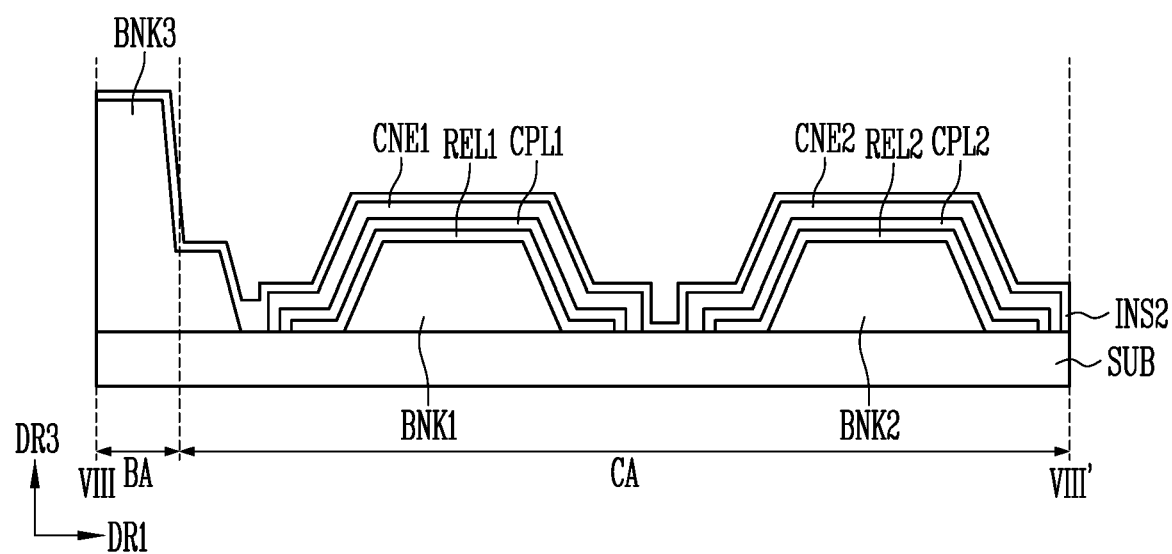
FIG. 8 is a cross-sectional view taken along the line VIII-VIII' of FIG. 5.
Figure 9:
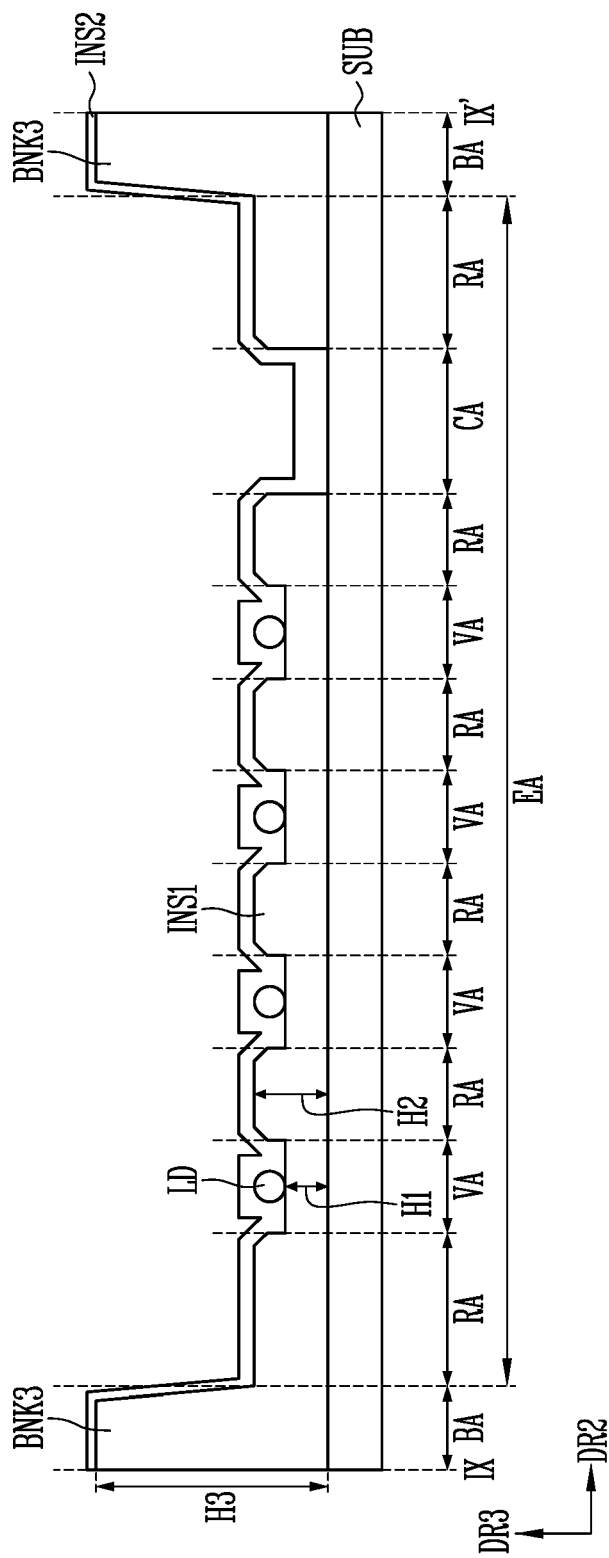
FIG. 9 is a cross-sectional view taken along the line IX-IX' of FIG. 5.

FIG. 5 is a plan view of a pixel according to an example embodiment; FIG. 6 is a cross-sectional view taken along the line VI-VI' of FIG. 5; FIG. 7 is a cross-sectional view taken along the line VII-VII' of FIG. 5; FIG. 8 is a cross-sectional view taken along the line VIII-VIII' of FIG. 5; and FIG. 9 is a cross-sectional view taken along the line IX-IX' of FIG. 5.

For better understanding and ease of description, each electrode is simplified and shown as a single electrode layer in FIGS. 6 to 9, but the present invention is not limited thereto. In an embodiment of the present invention, "formed and/or provided in the same layer" may mean that they are formed in the same process.

A plurality of light emitting elements LD are shown to be aligned in the first direction DR1 in FIG. 5, for better understanding and ease of description, but an arrangement of the light emitting elements LD is not limited thereto. For example, the light emitting elements LD may be aligned in an oblique direction between the first and second pixel electrodes.

Referring to FIGS. 1 to 9, a display device according to an example embodiment may include a substrate SUB, first and second bank layers BNK1 and BNK2, first and second pixel electrodes REL1 and REL2, first and second contact electrodes CNE1 and CNE2, a first insulation layer INS1, and a second insulation layer INS2.

The substrate SUB may include an insulating material such as glass, an organic polymer, quartz, and the like. In an embodiment, the substrate SUB may be formed of a material having flexibility to be bent or folded, and may have a single layer structure or a multi-layer structure.

The first bank layer BNK1 and the second bank layer BNK2 may be provided on the substrate SUB. A space for disposing the light emitting element LD may be provided between the first bank layer BNK1 and the second bank layer BNK2. In an example embodiment, the first bank layer BNK1 and the second bank layer BNK2 may be spaced in the first direction DR1 on the substrate SUB by more than a length of one light emitting element LD.

The first and second bank layers BNK1 and BNK2 may be an insulating material including an organic material or an inorganic material, but materials of the first and second bank layers BNK1 and BNK2 are not limited thereto.

In an embodiment, each of the first and second bank layers BNK1 and BNK2 may have sides with a trapezoidal shape inclined at angles (e.g., predetermined angles). However, shapes of the first and second bank layers BNK1 and BNK2 are not limited thereto and may have any of various shapes, such as a semi-ellipse, a circle, and a quadrangle.

A thickness HB of each of the first and second bank layers BNK1 and BNK2 may be thicker than a first thickness H1 and a second thickness H2 of the first insulation layer INS1 described later. Therefore, the light emitting element LD may be stably aligned in a space provided between the first and second bank layers BNK1 and BNK2.

Each of the first pixel electrode REL1 (or first electrode) and the second pixel electrode REL2 (or second electrode) may be provided on corresponding bank layers BNK1 and BNK2. For example, the first pixel electrode REL1 may be provided on the first bank layer BNK1, and the second pixel electrode REL2 may be provided on the second bank layer BNK2.

The first and second pixel electrodes REL1 and REL2 may be provided corresponding to the shape of the first and second bank layers BNK1 and BNK2. Accordingly, the first pixel electrode REL1 may have a shape corresponding to an inclination of the first bank layer BNK1, and the second pixel electrode REL2 may have a shape corresponding to an inclination of the second bank layer BNK2.

In an embodiment, the first and second pixel electrodes REL1 and REL2 may be provided to be spaced apart from each other in the first direction DR1 with one light emitting element LD therebetween on the substrate SUB, and to extend in the second direction DR2 crossing the first direction DR1.

In an example embodiment, the first pixel electrode REL1 may be disposed adjacent to a first end portion EP1 of each of the light emitting elements LD and may be electrically connected to each of the light emitting elements LD through a first contact electrode CNE1 (or third electrode), and the second pixel electrode REL2 may be disposed adjacent to a second end portion EP2 of each of the light emitting elements LD and may be electrically connected to each of the light emitting elements LD through a second contact electrode CNE2 (or fourth electrode).

In an embodiment, the first pixel electrode REL1 and the second pixel electrode REL2 may be disposed on a same plane and may have a same height. When the first pixel electrode REL1 and the second pixel electrode REL2 have the same height, the light emitting element LD may be more stably connected to the first and second pixel electrodes REL1 and REL2.

The first and second pixel electrodes REL1 and REL2 may be formed of a conductive material. In an embodiment, the conductive material may include any of metals, such as Ag, Mg, Al, Pt, Pd, Au, Ni, Nd, Ir, Cr, Ti, and alloys thereof.

In addition, the first and second pixel electrodes REL1 and REL2 may be formed as a single layer, but are not limited thereto, and may be formed as a multiple layer.

Here, the material of the first and second pixel electrodes REL1 and REL2 is not limited to the materials described above. For example, the first and second pixel electrodes REL1 and REL2 may be formed of conductive materials having a constant reflectance such that light emitted from both end portions EP1 and EP2 of the light emitting element LD proceeds in a direction in which the image is displayed (e.g., a front direction).

In an embodiment, since the first and second pixel electrodes REL1 and REL2 have a shape corresponding to a shape of the first and second bank layers BNK1 and BNK2, the light emitted from both end portions EP1 and EP2 of each of the light emitting elements LD may be reflected by the first and second pixel electrodes REL1 and REL2 to proceed further in the third direction DR3. Therefore, emission efficiency of the light emitted from each of the light emitting elements LD may be improved.

In an example embodiment, the first and second bank layers BNK1 and BNK2 may serve as a reflective member which improves the emission efficiency of the light emitted from each of the light emitting elements LD together with the first and second pixel electrodes REL1 and REL2 provided thereon.

One of the first and second pixel electrodes REL1 and REL2 may be an anode, and the other may be a cathode. In an example embodiment of the present invention, the first pixel electrode REL1 may be the anode, and the second pixel electrode REL2 may be the cathode.

For better understanding and ease of description, the first and second pixel electrodes REL1 and REL2 are shown to be provided directly on the substrate SUB, but are not limited thereto. For example, constituent elements to drive the display device with a passive matrix or an active matrix may be further provided between the first and second pixel electrodes REL1 and REL2 and the substrate SUB.

The first pixel electrode REL1 may be connected to a first connection line CNL1, and the second pixel electrode REL2 may be connected to a second connection line CNL2. In an embodiment, the first connection line CNL1 may be provided integrally with the first pixel electrode REL1, and the second connection line CNL2 may be provided integrally with the second pixel electrode REL2.

The first connection line CNL1 may be electrically connected to a first power line (not shown) through a first contact hole CT1. The second connection line CNL2 may be electrically connected to a second power line DVL through a second contact hole CT2.

In an embodiment, a first capping electrode CPL1 may be provided on the first pixel electrode REL1, and a second capping electrode CPL2 may be provided on the second pixel electrode REL2.

Each of the first and second capping electrodes CPL1 and CPL2 prevents or substantially prevents damage to the first and second pixel electrodes REL1 and REL2 that may occur during a manufacturing process of the display device. The first and second capping electrodes CPL1 and CPL2 may be formed of a transparent conductive material, but are not limited thereto.

In an embodiment, the first capping electrode CPL1 may be provided directly on the first pixel electrode REL1 to be electrically connected to the first pixel electrode REL1, and the second capping electrode CPL2 may be provided directly on the second pixel electrode REL2 to be electrically connected to the second pixel electrode REL2.

The first insulation layer INS1 may be provided on the first and second capping electrodes CPL1 and CPL2. In an example embodiment, the first insulation layer INS1 may be entirely provided on the substrate SUB to cover the first and second bank layers BNK1 and BNK2, the first and second pixel electrodes REL1 and REL2, and the first and second capping electrodes CPL1 and CPL2 described above.

In addition, the first insulation layer INS1 may be provided between the substrate SUB and each of the light emitting elements LD. The first insulation layer INS1 may fill a space between the substrate SUB and the light emitting element LD and may stably support the light emitting element LD.

In an embodiment, the first insulation layer INS1 may include one or more layers of photosensitive organic layers formed of a photoresist-based organic material, but is not limited thereto.

Each pixel PXL may be partitioned into an emission area EA and a bank area BA in a plane view. The emission area EA may be an area that emits light emitted from the light emitting element LD to the outside, including the light emitting element LD, and the bank area BA may be an area that is provided to surround the emission area EA to distinguish or separate the emission area EA of each PXL from each other. The bank area BA may be an area in which a bank pattern BNK3 to be described later is disposed.

The emission area EA may include a first area VA and a second area RA. The first area VA may be an area in which the light emitting element LD is disposed, and the second area RA may be an area provided around the first area VA to align the light emitting element LD in the first area VA. That is, the light emitting element LD may be aligned in the first area VA by the second area RA. The first area VA and the second area RA may be provided by extending in a direction (e.g., the first direction DR1) that crosses an extending direction (e.g., the second direction DR2) of the first pixel electrode REL1 and second pixel electrode REL2 in a plane view. In addition, the first area VA and the second area RA may be alternately provided in the second direction DR2.

The first insulation layer INS1 may have a different thickness in each area. In this case, the thickness of the first insulation layer INS1 may refer to a thickness of a laminate from the substrate SUB in the third direction DR3.

As shown in FIGS. 6 and 7, the first insulation layer INS1 may be disposed with a first thickness H1 in the first area VA, and the first insulation layer INS1 may be disposed with a second thickness H2 in the second area RA.

As shown in FIG. 9, the first thickness H1 of the first insulation layer INS1 disposed in the first area VA and the second thickness H2 of the first insulation layer INS1 disposed in the second area RA may be different from each other. In an embodiment, the first thickness H1 of the first insulation layer INS1 may be thinner than the second thickness H2 of the first insulation layer INS1. That is, the first insulation layer INS1 may have an uneven pattern formed on a surface in the second direction DR2.

In an embodiment, the light emitting elements LD disposed on the first insulation layer INS1 may be prepared with a form dispersed in a solution (e.g., a predetermined solution), and may be supplied to the emission area EA of each pixel PXL through an inkjet printing method. For example, the light emitting elements LD may be mixed with a volatile solvent and dropped into each emission area EA.

At this time, when a voltage (e.g., a predetermined voltage) is supplied through the first and second pixel electrodes REL1 and REL2 of each pixel PXL, an electric field may be formed between the first and second pixel electrodes REL1 and REL2, and then the light emitting elements LD may be aligned between the first and second pixel electrodes REL1 and REL2. After the light emitting elements LD are aligned, the solvent may be volatilized or removed in other ways to stably arrange the light emitting elements LD between the first and second pixel electrodes REL1 and REL2.

As described above, when the first insulation layer INS1 has the first area VA and the second area RA with different thicknesses in the emission area EA, the light emitting elements LD provided in a form dispersed in the solution may be aligned in the first area VA having a relatively low thickness. Accordingly, the light emitting elements LD may be distributed evenly on the whole of the emission area LD without being disposed on only one side of the emission area LD.

For better understanding and ease of description, a structure in which the light emitting elements LD are not disposed in the second area RA is shown in FIGS. 5 to 9, but some of the light emitting elements LD may be disposed in the second area RA. However, the number of the light emitting elements LD disposed in the second area RA may be smaller than the number of light emitting elements LD disposed in the first area VA.

In an embodiment, a contact area CA may be further provided in the emission area EA. The contact area CA may be provided adjacent to a side of the emission area EA.

As shown in FIG. 8, the contact area CA may be an area in which the first insulation layer INS1 is not disposed. That is, the first capping electrode CPL1 and the second capping electrode CPL2 may be exposed to the outside in the contact area CA.

In the contact area CA, the first capping electrode CPL1 may contact the first contact electrode CNE1, and the first capping electrode CPL1 may be electrically connected to an end portion of each of the light emitting elements LD through the first contact electrode CNE1. In addition, the second capping electrode CPL2 may contact the second contact electrode CNE2, and the second capping electrode CPL2 may be electrically connected to another end portion of each of the light emitting elements LD through the second contact electrode CNE2.

According to an example embodiment, when the first capping electrode CP1 and the second capping electrode CP2 are not included, the first pixel electrode REL1 and the second pixel electrode REL2 may be exposed to the outside, the first pixel electrode REL1 may contact the first contact electrode CNE1, and the second pixel electrode REL2 may contact the second contact electrode CNE2.

In an embodiment, the bank pattern BNK3 may be disposed in the bank area BA. In an embodiment, at least one light emitting element LD disposed in the emission area EA may be surrounded by the bank pattern BNK3 disposed in the corresponding pixel PXL in a plane view.

In an embodiment, as shown in FIG. 5, the bank pattern BNK3 may be integrally connected and disposed. In addition, the bank pattern BNK3 may be formed concurrently (e.g., simultaneously) through a same process as the first insulation layer INS1. That is, the bank pattern BNK3 may be integrally formed with the first insulation layer INS1, and the bank pattern BNK3 may include a same material as the first insulation layer INS1.

In an embodiment, the bank pattern BNK3 may have a trapezoidal cross-section that becomes narrower toward the top, similar to the first bank layer BNK1 and the second bank layer BNK2, but is not limited thereto. In another example, the bank pattern BNK3 may have a curved surface having a cross-section such as a semi-circle or semi-ellipse that becomes narrower toward the top. In the present invention, a shape and/or an inclination of the bank pattern BNK3 is not particularly limited, and may be variously changed.

The thickness H3 of the bank pattern BNK3 may be thicker than the first thickness H1 and the second thickness H2 of the first insulation layer INS1 described above. In addition, the bank pattern BNK3 may be formed thicker than the first bank layer BNK1 and the second bank layer BNK2.

The bank pattern BNK3 may be disposed along a boundary of each pixel PXL to prevent or substantially prevent light leakage between adjacent pixels PXL. In addition, the bank pattern BNK3 may prevent or substantially prevent a solution including the light emitting elements LD from leaking to the adjacent pixel PXL in the process of aligning the light emitting elements LD in the emission area EA.

As described above, the bank pattern BNK3 may be formed concurrently (e.g., simultaneously) with the first insulation layer INS1, thereby reducing a manufacturing cost and manufacturing time of the display device.

The first and second contact electrodes CNE1 and CNE2 may be provided on the first insulation layer INS1 and the light emitting element LD.

The first contact electrode CNE1 may cover the first pixel electrode REL1 and may overlap with the first pixel electrode REL1 in a plane view.

In addition, the first contact electrode CNE1 may partially overlap with one of both end portions EP1 and EP2 of each light emitting element LD. For example, the first contact electrode CNE1 may partially overlap the first end portion EP1 of each light emitting element LD.

The first contact electrode CNE1 may be electrically connected to the first capping electrode CPL1 in the contact area CA. Since the first capping electrode CPL1 is electrically connected to the first pixel electrode REL1, the first contact electrode CNE1 may be connected to the first pixel electrode REL1.

The second contact electrode CNE2 may cover the second pixel electrode REL2 and may overlap with the second pixel electrode REL2 in a plane view.

The second contact electrode CNE2 may be electrically connected to the second capping electrode CPL2 in the contact area CA. Since the second capping electrode CPL2 is electrically connected to the second pixel electrode REL2, the second contact electrode CNE2 may be connected to the second pixel electrode REL2.

According to an example embodiment, when the second capping electrode CPL2 is omitted, the second contact electrode CNE2 may be directly connected to the second pixel electrode REL2 through the contact area CA of the first insulation layer INS1.

In an embodiment, each of the first and second contact electrodes CNE1 and CNE2 may be formed of a transparent conductive material such that light emitted from each of the light emitting elements LD may proceed in the front direction without loss. For example, the transparent conductive material may include ITO, IZO, ITZO, or the like. However, the material of the first and second contact electrodes CNE1 and CNE2 is not limited to the materials described above.

In an example embodiment of the present invention, the first and second contact electrodes CNE1 and CNE2 may be provided on the same plane.

The second insulation layer INS2 may be provided on the first and second contact electrodes CNE1 and CNE2. The second insulation layer INS2 may prevent or substantially prevent the first and second contact electrodes CNE1 and CNE2 from being exposed to the outside to prevent or substantially prevent the first and second contact electrodes CNE1 and CNE2 from corroding.

The second insulation layer INS2 may serve as an encapsulation layer that prevents or substantially prevents oxygen, moisture, etc. from penetrating into the light emitting elements LD.

The second insulation layer INS2 may include an inorganic insulation layer formed of an inorganic material or an organic insulation layer formed of an organic material. In an embodiment, the second insulation layer INS2 may be formed as a single layer as shown in the drawings, but is not limited thereto, and may be formed of a multiple layer.

According to an example embodiment, an overcoat layer (not shown) may be further provided on the second insulation layer INS2. The overcoat layer may be a planarization layer that mitigates steps generated by the first and second bank layers BNK1 and BNK2, the first and second pixel electrodes REL1 and REL2, and the first and second contact electrodes CNE1 and CNE2 disposed thereunder. In addition, the overcoat layer may serve as an encapsulation layer that prevents or substantially prevents oxygen, moisture, etc. from penetrating into the light emitting elements LD.

As described above, the first insulation layer INS1 disposed on the emission area EA may have different thicknesses in each area. The first thickness H1 of the first insulation layer INS1 disposed in the first area VA may be thinner than the second thickness H2 of the first insulation layer INS1 disposed in the second area RA, and the first area VA and the second area RA may be alternately provided to form an uneven pattern.

The light emitting elements LD may be aligned in the first area VA in which the first insulation layer INS1 is relatively thinly disposed. Due to a difference in the thickness of the first insulation layer INS1, the light emitting elements LD may be distributed evenly without being disposed on only one side of the emission area EA. That is, in each pixel PXL, an alignment of the light emitting elements LD may be improved due to the uneven pattern of the first insulation layer INS1.

In addition, the bank pattern BNK3 provided in the bank area BA surrounding the emission area EA may be concurrently (e.g., simultaneously) formed integrally with the first insulation layer INS1. Accordingly, a manufacturing cost of the display device including the first insulation layer INS1 and the bank pattern BNK3 may be reduced, and a manufacturing time thereof may be reduced.

Herein, another example embodiment of the display device will be described. In the following example embodiments, the same components as those of the previously described embodiments are denoted by the same reference numerals, and the description thereof may be omitted or simplified.

Figure 10:
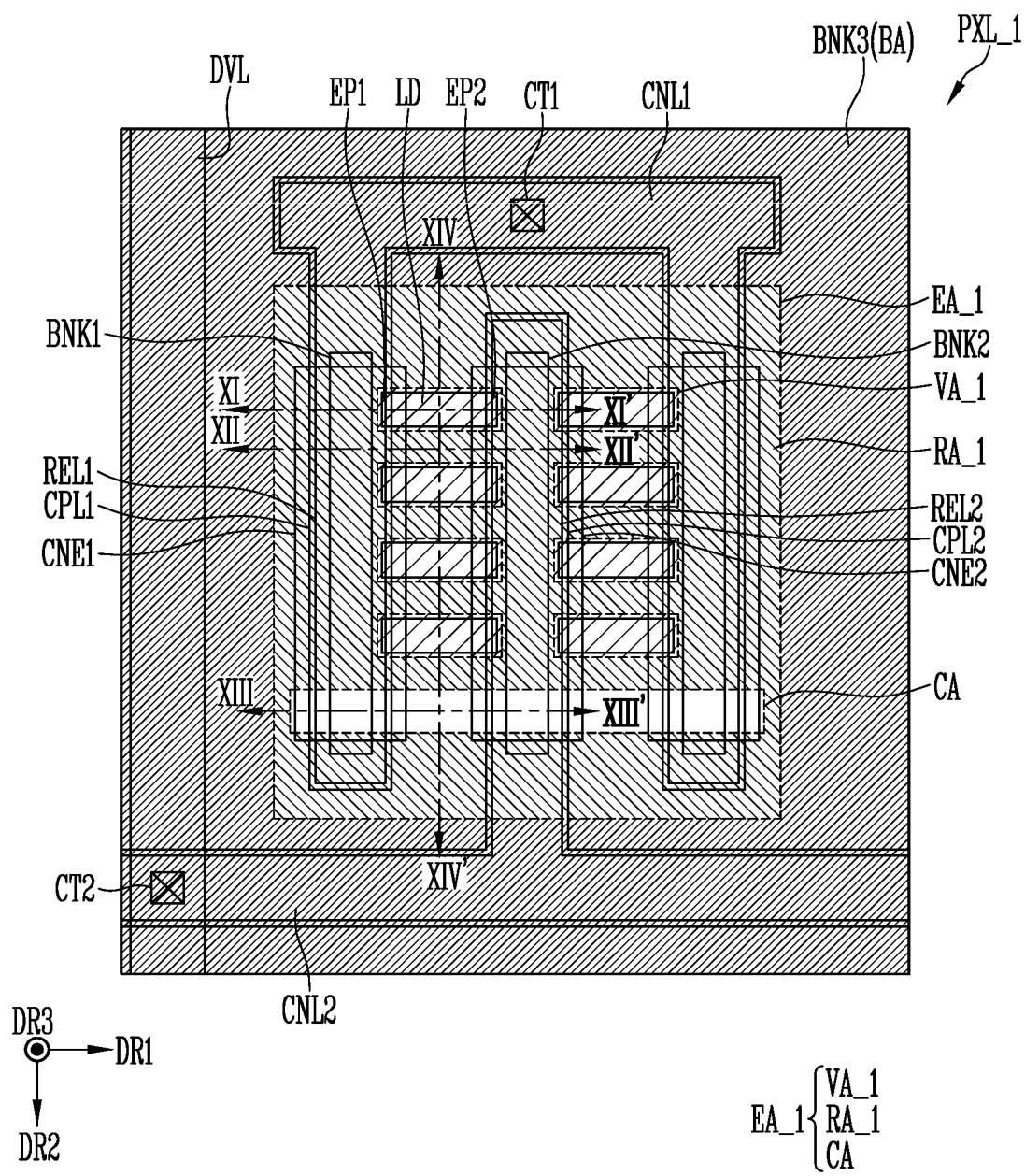
FIG. 10 is a plan view of a pixel according to another example embodiment.
Figure 11:
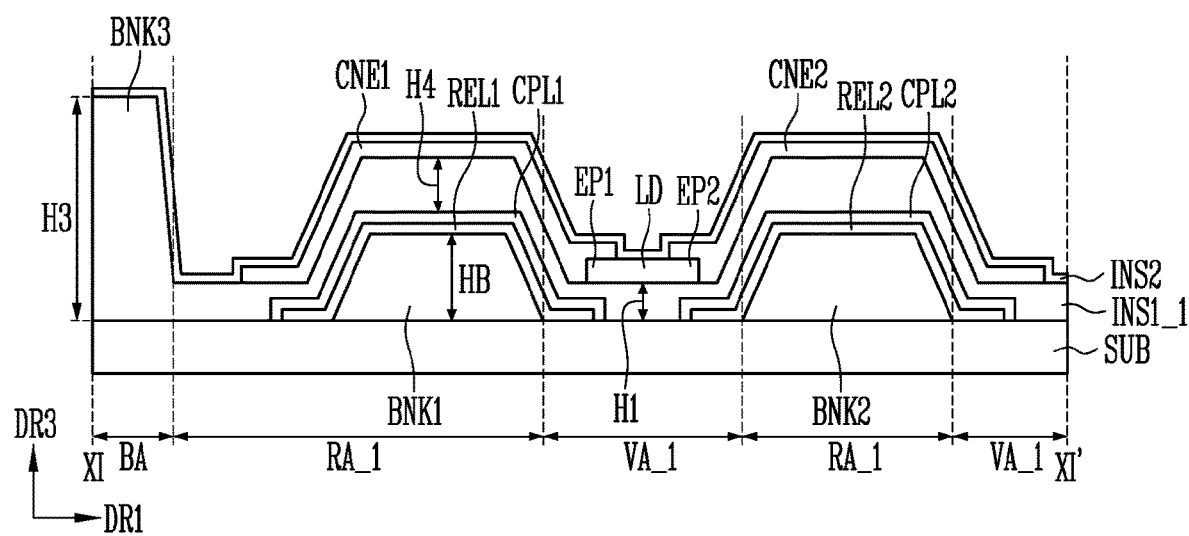
FIG. 11 is a cross-sectional view taken along the line XI-XI' of FIG. 10.

FIG. 10 is a plan view of a pixel according to another example embodiment; and FIG. 11 is a cross-sectional view taken along the line XI-XI' of FIG. 10. The example embodiment of FIGS. 10 and 11 is different from the example embodiment of FIGS. 5 to 9 in that a first area VA_1 is provided only in an area where the light emitting element LD is disposed, and a second area RA_1 is provided to surround the first area VA_1.

In an embodiment, a cross-sectional view taken along the line XII-XII' of FIG. 10 is substantially the same as FIG. 7 which is a cross-sectional view taken along the line VII-VII' of FIG. 5, a cross-sectional view taken along the line XIII-XIII' of FIG. 10 is substantially the same as FIG. 8 which is a cross-sectional view taken along the line VIII-VIII' of FIG. 5, and a cross-sectional view taken along the line XIV-XIV' of FIG. 10 is substantially the same as FIG. 9 which is a cross-sectional view taken along the line IX-IX' of FIG. 5. Therefore, a detailed description thereof is omitted, and FIG. 11, which is a cross-sectional view taken along the line XI-XI' of FIG. 10, will be mainly described.

Referring to FIGS. 5 to 11, a pixel PXL_1 according to another example embodiment may include an emission area EA_1 in which light emitted from the light emitting elements LD is emitted and a bank area BA surrounding a circumference of the emission area EA_1 in a plane view. The emission area EA_1 may include a plurality of first area VA_1 in which the light emitting element LD is disposed and a second area RA_1 surrounding the first area VA_1.

A first insulation layer INS1_1 including an uneven pattern formed on a surface thereof may be provided in the emission area EA_1. The first insulation layer INS1_1 may have a first thickness H1 in the first area VA_1 and a second thickness H2 (see FIG. 7) in the second area RA_1.

In an embodiment, a bank pattern BNK3 may be provided in the bank area BA to surround the light emitting elements LD. The bank pattern BNK3 may have a third thickness H3 thicker than first thickness H1 and second thickness H2. In an embodiment, the bank pattern BNK3 may be concurrently (e.g., simultaneously) formed by a same process as the first insulation layer INS1_1, and may include a same material as the first insulation layer INS1_1.

In an embodiment, the first insulation layer INS1_1 may be continuously disposed on the emission area EA_1 and may also be disposed on the first bank layer BNK1 and the second bank layer BNK2. The first insulation layer INS1_1 disposed on the first bank layer BNK1 and the second bank layer BNK2 may have a fourth thickness H4. In an embodiment, the first thickness H1 of the first insulation layer INS1_1 may be different from the fourth thickness H4. For example, the fourth thickness H4 of the first insulation layer INS1_1 may be thicker than the first thickness H1. In an embodiment, the fourth thickness H4 may be equal to or less than the second thickness H2.

The first insulation layer INS1_1 in the example embodiment shown in FIGS. 10 to 11 may be disposed thicker on the first and second bank layers BNK1 and BNK2 than the first insulation layer INS1 in the example embodiment shown in FIGS. 5 to 9. Accordingly, the light emitting elements LD may be easily disposed between the first bank layer BNK1 and the second bank layer BNK2, and the alignment of the light emitting elements LD may be further improved in the pixel PXL_1.

While some example embodiments of the present invention are described with reference to the attached drawings, it will be understood by those of ordinary skill in the technical field to which the present invention pertains that the present invention may be carried out in other specific forms without changing the technical idea or essential features. Accordingly, the above-described example embodiments should be considered in a descriptive sense and not for purposes of limitation.

What is claimed is:

1. A display device comprising:
a substrate comprising first areas and second areas alternately arranged along a first direction in a plane view;
a first electrode and a second electrode on the substrate and spaced apart from each other along a second direction crossing the first direction, each of the first electrode and the second electrode extending along the first direction from a first area of the first areas to a second area of the second areas;
a first insulation layer on the substrate and covering the first electrode and the second electrode in each of the first area and the second area; and
a light emitting element on the first insulation layer and electrically connected to the first electrode and the second electrode;
wherein the first insulation layer has a first thickness in the first area and a second thickness thicker than the first thickness in the second area, such that the first insulation layer has the first thickness and the second thickness alternately along the first direction, and
an entirety of the light emitting element is located in the first area.

2. The display device of claim 1, wherein
the substrate further comprises a bank area around the first areas and the second areas, and
the display device further comprises a bank pattern on the substrate and located in the bank area.

3. The display device of claim 2, wherein the bank pattern is integrally formed with the first insulation layer.

4. The display device of claim 3, wherein the bank pattern has a third thickness thicker than each of the first thickness and the second thickness.

5. The display device of claim 1, further comprising:
a third electrode on the light emitting element and electrically connected to the first electrode and a first end portion of the light emitting element; and
a fourth electrode on the light emitting element and electrically connected to the second electrode and a second end portion of the light emitting element.

6. The display device of claim 5, wherein
the substrate further comprises a contact area, and
the first insulation layer exposes at least a portion of the first electrode and at least a portion of the second electrode in the contact area.

7. The display device of claim 6, wherein the first electrode contacts the third electrode, and the second electrode contacts the fourth electrode in the contact area.

8. The display device of claim 5, further comprising a second insulation layer on the substrate and covering the first insulation layer, the light emitting element, the third electrode, and the fourth electrode.

9. The display device of claim 1, wherein the first areas and the second areas extend in the second direction.

10. The display device of claim 1, wherein the first areas are spaced apart from each other in the first direction, and the second areas surround the first areas.

11. The display device of claim 10, wherein the first insulation layer has a fourth thickness on the first electrode and the second electrode, and the fourth thickness is thicker than the first thickness.

12. The display device of claim 1, wherein the first insulation layer covers an upper surface of the first electrode and an upper surface of the second electrode.

13. A display device comprising:
a substrate comprising first areas and second areas alternately arranged along a first direction in a plane view;
a first electrode and a second electrode on the substrate and spaced apart from each other along a second direction crossing the first direction;
a first insulation layer on the substrate and covering the first electrode and the second electrode;
a light emitting element on the first insulation layer and electrically connected to the first electrode and the second electrode;
a first bank layer between the substrate and the first electrode, and
a second bank layer between the substrate and the second electrode, wherein the first insulation layer has a first thickness in the first areas and a second thickness thicker than the first thickness in the second areas, each of a thickness of the first bank layer and a thickness of the second bank layer is thicker than the second thickness of the first insulation layer, and the light emitting element is located in a first area of the first areas.

14. A display device comprising:

a substrate;

a first electrode and a second electrode on the substrate and spaced apart from each other in a first direction;

a first insulation layer on the substrate and covering an upper surface of the first electrode and an upper surface of the second electrode;

a light emitting element on the first insulation layer and electrically connected to the first electrode and the second electrode;

a third electrode on the light emitting element and electrically connected to the first electrode and a first end portion of the light emitting element;

a fourth electrode on the light emitting element and electrically connected to the second electrode and a second end portion of the light emitting element; and a bank pattern on the substrate and arranged around the light emitting element, wherein the first insulation layer and the bank pattern are integrally formed, and wherein an upper surface of the bank pattern is higher than an upper surface of the light emitting element.

15. The display device of claim 14, wherein the substrate further comprises a contact area, and the first insulation layer exposes at least a portion of the first electrode and at least a portion of the second electrode in the contact area.

16. The display device of claim 15, wherein the first electrode contacts the third electrode and the second electrode contacts the fourth electrode in the contact area.

17. The display device of claim 14, further comprising a second insulation layer on the substrate and covering the first insulation layer, the bank pattern, the light emitting element, the third electrode, and the fourth electrode.

18. A display device comprising:

a substrate;

a first electrode and a second electrode on the substrate and spaced apart from each other in a first direction;

a first insulation layer on the substrate and covering the first electrode and the second electrode;

a light emitting element on the first insulation layer and electrically connected to the first electrode and the second electrode;

a bank pattern on the substrate and arranged around the light emitting element;

a first bank layer between the substrate and the first electrode; and a second bank layer between the substrate and the second electrode, wherein the first insulation layer and the bank pattern are integrally formed, and wherein a thickness of the first bank layer and a thickness of the second bank layer are thinner than a thickness of the bank pattern.

* * * * *